United States Patent [19]

Yamada

[11] Patent Number: 5,693,965
[45] Date of Patent: Dec. 2, 1997

[54] LASER DIODE HAVING NARROWED RADIATION ANGLE CHARACTERISTIC

[75] Inventor: Hirohito Yamada, Tokyo, Japan

[73] Assignee: NEC Corporation, Tokyo, Japan

[21] Appl. No.: 743,086

[22] Filed: Nov. 4, 1996

[30] Foreign Application Priority Data

Nov. 2, 1995 [JP] Japan .................. 7-308506

[51] Int. Cl.$^6$ .................. H01L 33/00
[52] U.S. Cl. .................. 257/94; 257/95; 257/96; 257/97; 257/98; 372/45; 372/46; 372/47; 372/48; 372/49
[58] Field of Search .................. 257/94, 95, 96, 257/97, 98; 372/45, 46, 47, 48

[56] References Cited

U.S. PATENT DOCUMENTS

| | | | |
|---|---|---|---|
| 3,888,388 | 6/1975 | Kressel et al. .................. | 257/96 |
| 4,520,485 | 5/1985 | Sugino et al. .................. | 372/48 |
| 5,602,864 | 2/1997 | Welch et al. .................. | 372/50 |

FOREIGN PATENT DOCUMENTS

| | | | |
|---|---|---|---|
| 56-073485 | 6/1981 | Japan . | |
| 56-73485 | 6/1981 | Japan .................. | 257/94 |
| 61-96779 | 5/1986 | Japan .................. | 257/94 |
| 62-245690 | 10/1987 | Japan . | |
| 2-199889 | 8/1990 | Japan . | |

OTHER PUBLICATIONS

No Author, "High Performance Quantum Well GaAs Distributed Feedback and Reflector Structures", *IBM Technical Disclosure Bulletin*, vol. 31, No. 12, pp. 172–173, May 1989.

H. Kobayashi et al., "Tapered Thickness MQW Waveguide BH MQW Lasers", *IEEE Photonics Technology Letters*, vol. 6, No. 9, Sep. 1994, pp. 1080 and 1081.

I. Moerman, et al., "Monolithic integration of a spot size transformer with a planar buried heterostructure in GaAsP/InP–laser using the shadow masked growth technique", Aug. 1994, pp. 888–890, IEEE Photonics Technology Letters, vol. 6, No. 8.

T. Murakami, et al., "A very narrow–beam AlGaAs laser with a thin tapered–thickness active layer (T3 laser)", Jun. 1987, pp. 712–719, IEEE Journal of Quantum Electronics, vol. QE–23, No. 6.

*Primary Examiner*—William Mintel
*Attorney, Agent, or Firm*—Young & Thompson

[57] ABSTRACT

An active layer 102 and a clad layer 103 are formed on a semiconductor substrate 101. The active layer including an optical guide layer and an optical confinement layer/formed so that the thickness of the active layer gradually decreases toward a light-emission-side end facet. Since a spot size is gradually expanded toward an emission end, the radiation angle of an emitted beam is narrowed and characteristics including a threshold current become superior.

5 Claims, 4 Drawing Sheets

1

LASER DIODE HAVING NARROWED RADIATION ANGLE CHARACTERISTIC

BACKGROUND OF THE INVENTION

1. Field of the Invention

The present invention relates to a structure of a laser diode, particularly to a structure of a laser diode suitable for a low-cost alignment-free mounting-type laser module requiring a narrowed radiation angle.

2. Description of the Prior Art

In recent years, a low-cost laser diode (LD) module has been requested for an optical subscriber system. The device mounting cost accounts for a large percentage in the LD module cost. In the case of a conventional laser diode used for the LD module of this type, the light radiation angle at the light emission end facet is approx. 30° in the direction vertical to an active layer and approx. 25° in the direction parallel to the active layer which are large values. Therefore, the conventional laser diode cannot directly be optically combined with an optical fiber and thus, a lens must be set between the laser diode and the optical fiber. Resultingly, the assembly cost increases. Moreover, it is necessary to mount components while aligning the optical axis of each component with a lens system and it takes a lot of time for the alignment because the tolerance is small, causing the mounting cost to increase.

However, an LD which can be optically combined directly with an optical fiber with no lens system has recently been proposed in the paper "Tapered Thickness MQW Waveguide BH MQW lasers" described in IEEE PHOTONICS TECHNOLOGY LETTERS. Vol. 6, No. 9, September 1994, pp. 1080–1081. This LD, as shown in FIG. 1, is constituted by forming an active layer (including a light guide layer) 602 whose thickness is constant in an LD area but gradually decreased toward the light-emission-side end facet in a spot size conversion area 609 on a semiconductor substrate 601, moreover forming a clad layer 603 on the active layer 602, and thereafter forming a first electrode 604 and a second electrode 605 on the top and the bottom of the substrate. This LD can directly be combined with an optical fiber because the spot size of a beam emitted from the LD area 608 is expanded while the beam propagates through a tapered waveguide portion of the spot size conversion area 609 as shown by an optical electric-field distribution 612 and a laser beam 610 emitted from the device is narrowed in both horizontal and vertical directions. Therefore, it is possible to disuse an optical system and realize alignment-free mounting and thus, greatly decrease the mounting cost.

In the cost of the conventional narrowed radiation angle laser diode with a spot size converter shown in FIG. 1, a loss is produced in the optical waveguide of the spot size conversion area 609 have a large optical loss and therefore, the threshold current, driving current, and temperature characteristic (temperature dependency of threshold and slope efficiency) are inferior to those of a conventional LD without the spot size converter because a laser basically has a long optical cavity structure including a spot size conversion area. The threshold current is raised due to increase in cavity length because an area to which current is injected is lengthened. Therefore, it is necessary to decrease the overall device length. However, when excessively shortening a spot-side size-conversion optical waveguide, it is impossible to completely perform spot size conversion. Therefore, it cannot be avoided that a device length is increased to a certain extent (normally, 500 μm or more). Moreover, because a tapered waveguide portion serves as an attenuator of light, the external optical efficiency is lowered.

SUMMARY OF THE INVENTION

The present invention is made to solve the above problems of the conventional narrowed radiation angle LD and its object is to provide a laser diode having a narrowed radiation angle characteristic and superior low-threshold current and temperature characteristics.

A laser diode of the present invention to achieve the above object is characterized in that the thickness of an active layer including an optical guide layer continuously decreases from a first end facet toward a second end facet serving as a main optical output end facet.

Moreover, a structure is used in which a laser area and a spot size conversion area are tandem joined by forming a diffraction grating on a part between a substrate and an active layer and forming an electrode in a range from the first end facet up to the diffraction grating position. Thereby, it is possible to further decrease an oscillation threshold current.

DETAILED DESCRIPTION OF THE PREFERRED EMBODIMENTS

Figure 1:
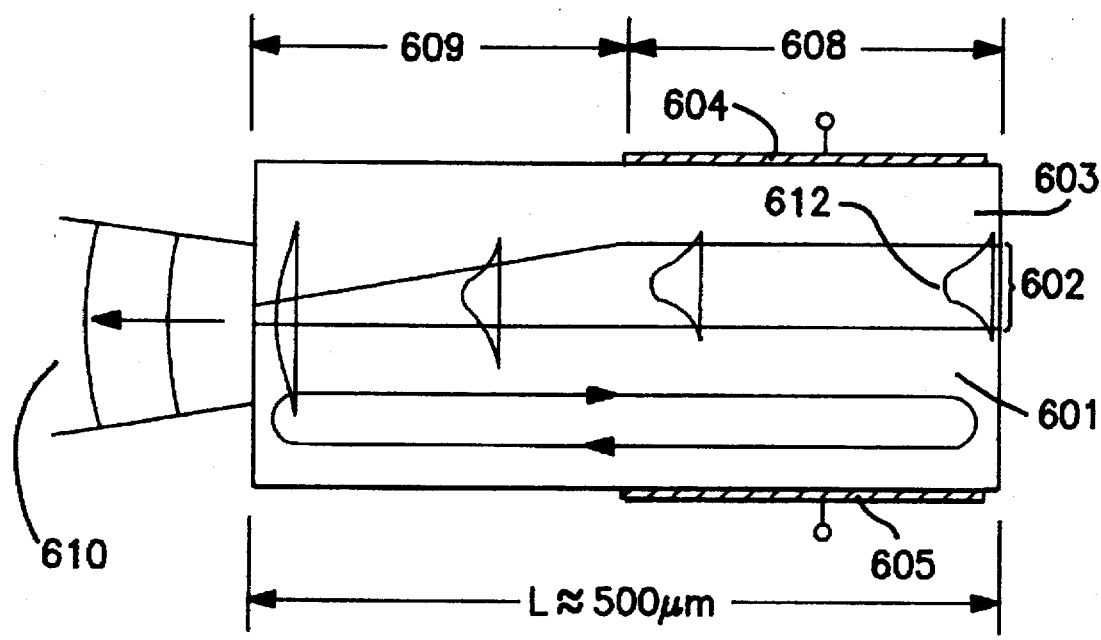
FIG. 1 is longitudinal sectional view showing a conventional laser diode.
Figure 2:
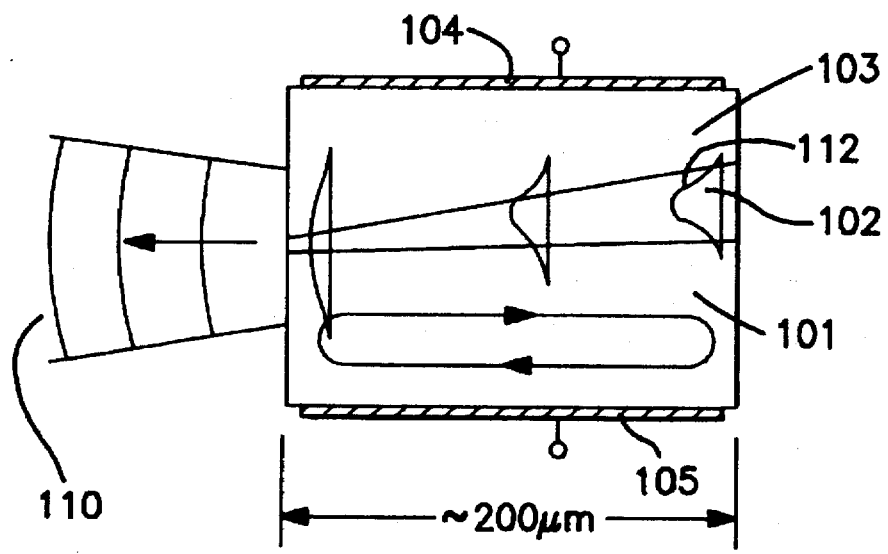
FIG. 2 is longitudinal sectional view taken along an optical axis, for explaining a first basic structure of the present invention.

As shown in FIG. 2, a laser diode of the present invention is constituted by forming an active layer 102 and a clad layer 103 on a semiconductor substrate 101 and forming a first electrode 104 and a second electrode 105 at the top of the clad layer 103 and the bottom of the substrate 101, respectively, in which the thickness of the active layer gradually decreases toward a optical-emission-side end facet. In this case, the active layer 102 includes an optical guide layer (optical confinement layer).

In the case of the laser diode thus constituted, because a spot size is gradually expanded toward the emission end as shown by an optical electric-field distribution 112 in FIG. 2, the radiation angle of an emitted beam 110 is narrowed to approx. 10° in both vertical and horizontal directions. Moreover, it is possible to control the device length to 200 μm or less because a spot size conversion area is not additionally formed. Therefore, the present invention makes it possible to emit a beam at a narrowed radiation angle in which the beam can directly be combined with an optical fiber while keeping device characteristics such as threshold current, temperature characteristic, and external optical efficiency at preferable values equal to those of a short resonator.

Then, the first embodiment of the present invention is described below by referring to FIGS. 3 and 4.

Figure 3A:
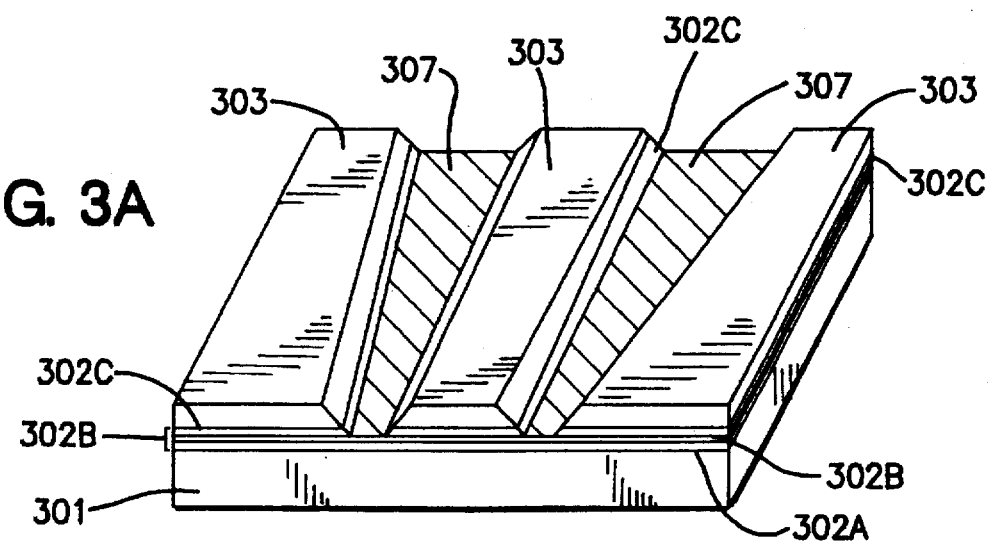
FIGS. 3A to 3C are perspective views showing steps for explaining a method for fabricating the first embodiment of the present invention.

For example, to fabricate a 1.3 µm-wavelength narrow radiation-angle LD, as shown in FIG. 3A, 40 nm-thick 1.13 µm-wavelength n-InGaAs serving as an optical confinement layer is deposited on an n-InP substrate 301 to form a bottom SCH (Separate Confinement Heterostructure) layer 302a and moreover deposit a strained MQW (Multi-Quantum Well) active layer 302b of a five-well structure comprising a 5 nm-thick 1.40 µm-wavelength non-doped InGaAsP well layer and 10 nm-thick 1.13 µm-wavelength non-doped InGaAsP barrier layer on the layer 302a.

Then, a pair of SiO2 masks 307 having a pattern in which the mask width is gradually decreased toward an end facet serving as a laser beam emission end are formed on the surface of a wafer with the MQW layer formed on it and a 1.13 um-wavelength p-InGaAsP layer is selectively deposited as a top optical confinement layer by using the masks 307 as deposition masks to form a top SCH layer 302c. In this case, as the width of the masks 307 increases, the thickness of an optical guide layer to be formed on a slit area between the both masks increases. Therefore, the tapered top SCH layer 302c is formed and thereby, tapered active layers (302a, 302b, and 302c) are obtained.

Figure 3B:
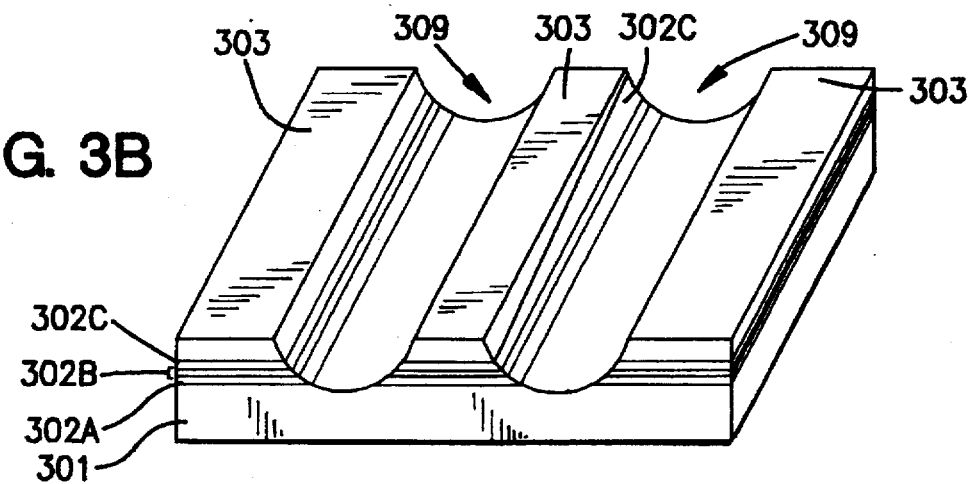
Figure 3C:
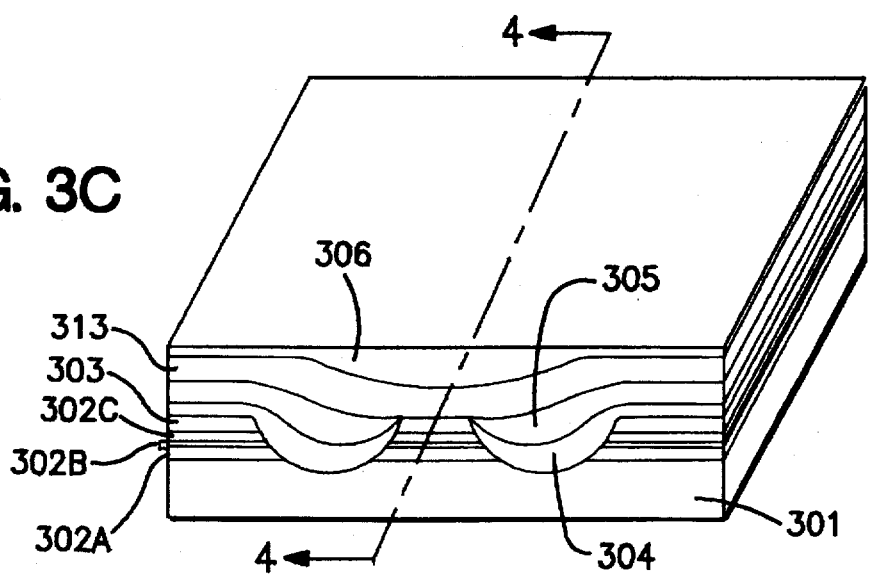

Thereafter, both masks 307 are removed and moreover, a pair of parallel grooves 309 are formed through etching as shown in FIG. 3B. Then, as shown in FIG. 3C, a p-InP buried layer 304, an n-InP current block layer 305, a p-InP clad layer 313, and a p-InGaAsP cap layer 306 are formed in order to form a so-called DC-PBH (Double-Channel Planar Buried Heterostructure).

Figure 4:
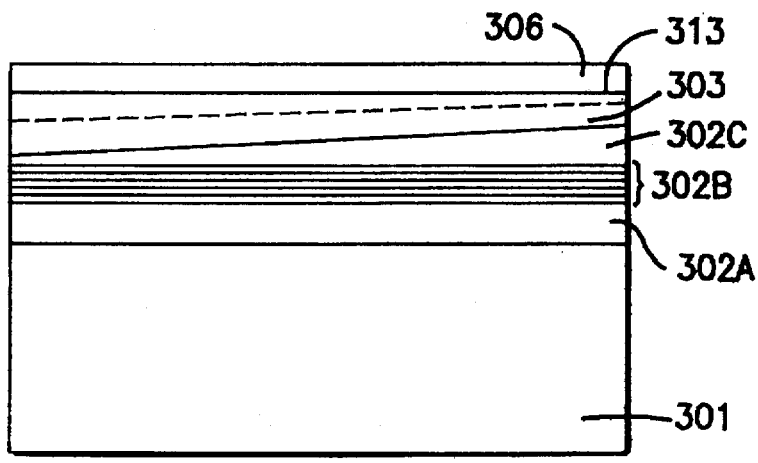
FIG. 4 is a sectional view taken along the line A—A in FIG. 3C.

As shown in FIG. 4, the top SCH layer 302C is tapered so as to decrease in thickness toward the light emission end facet at the longitudinal section along the optical axis of a laser device having the above structure. Because the clad layers 303 and 313 formed on the SCH layer 302C are made of the same material, the boundary between the layers is not actually present though it is shown by a dotted line as a reference.

Thereafter, top and bottom electrodes are formed as shown in FIG. 2 and then cut out as a device with a length of approx. 200 µm to fabricate a laser diode structure. Finally, by applying coating to the front and the rear facets so that reflectances of approx. 70% and 95% are obtained respectively, a laser diode is obtained which has a narrow radiation angle of approx. 10° in both horizontal and vertical directions, a low threshold current of approx. 5 mA, and a preferable temperature characteristic. Though the DC-PBH buried structure is described above, it is a matter of course that the same advantage can be expected even by using other buried structure or ridge structure such as PBH.

Figure 5:
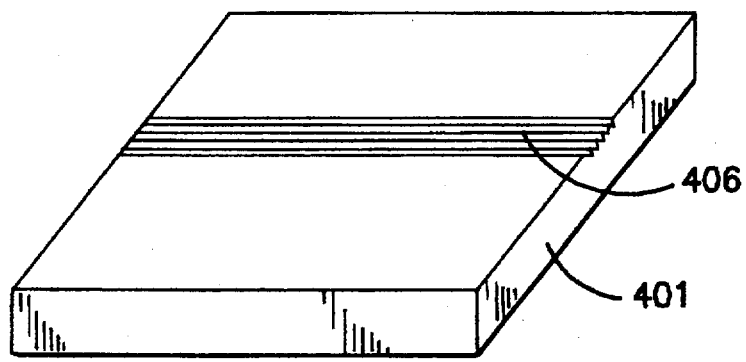
FIG. 5 is a perspective view for explaining a method for fabricating the second embodiment of the present invention.

Then, the second embodiment of the present invention is described below by referring to FIGS. 5 and 6. First, as shown in FIG. 5, a diffraction grating 406 with a pitch of 202 nm and a corruption depth of approx. 30 nm is formed on a part of an n-InP substrate 401 over a length of 50 µm so as to extend in the direction perpendicular to the optical axis direction. Then, as shown in FIG. 6, a bottom SCH layer 402a made of 40 nm-thick 1.13 µm-wave-length n-InGaAsP is deposited on the diffraction grating 406 and moreover, a strained MQW active layer 402b of a five-well structure comprising a 5 nm-thick 1.40 µm-wavelength non-doped InGaAsP well layer and a 10 nm-thick 1.18 µm-wavelength non-doped InGaAsP barrier layer is deposited.

Moreover, 1.13 µm-wavelength p-InGaAsP is selectively deposited in accordance with the same process as that shown in FIG. 3A to form a top SCH layer 402c whose thickness gradually decreases toward the light emission end.

Figure 6:
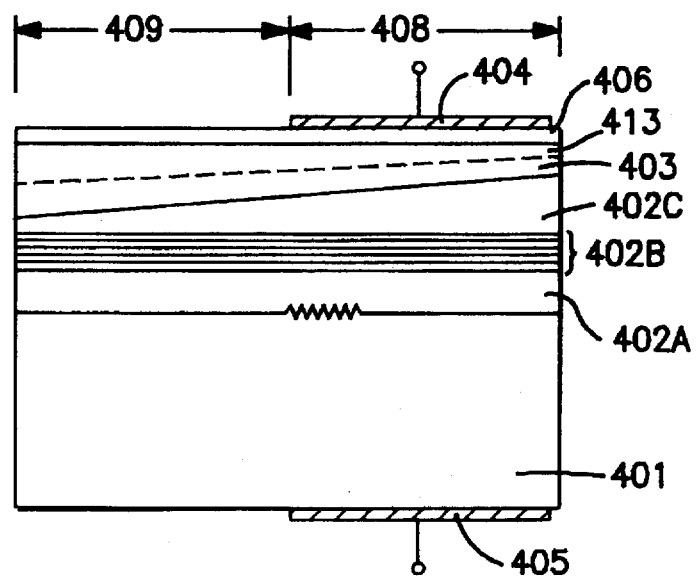
FIG. 6 is a sectional view of the laser diode of the second embodiment of the present invention taken along the optical axis.

Thereafter, in accordance with the same composition and process as those shown in FIGS. 3B and 3C, a DC-PBH structure is obtained and a device having a clad layers 403 and 413 and a cap layer 40 is obtained as shown in FIG. 6. A first electrode 404 and a second electrode 405 are formed only on a part of the device to fabricate a laser diode having a laser characteristic area and a spot size conversion area 409 having no polarity. Finally, by applying coating to the front and the rear so that reflectances are of approx. 0% and 95% respectively, it is possible to further shorten the current injection area compared to the case of the first embodiment. Therefore, a laser diode with lower threshold current and more preferable temperature characteristic can be expected.

Figure 7:
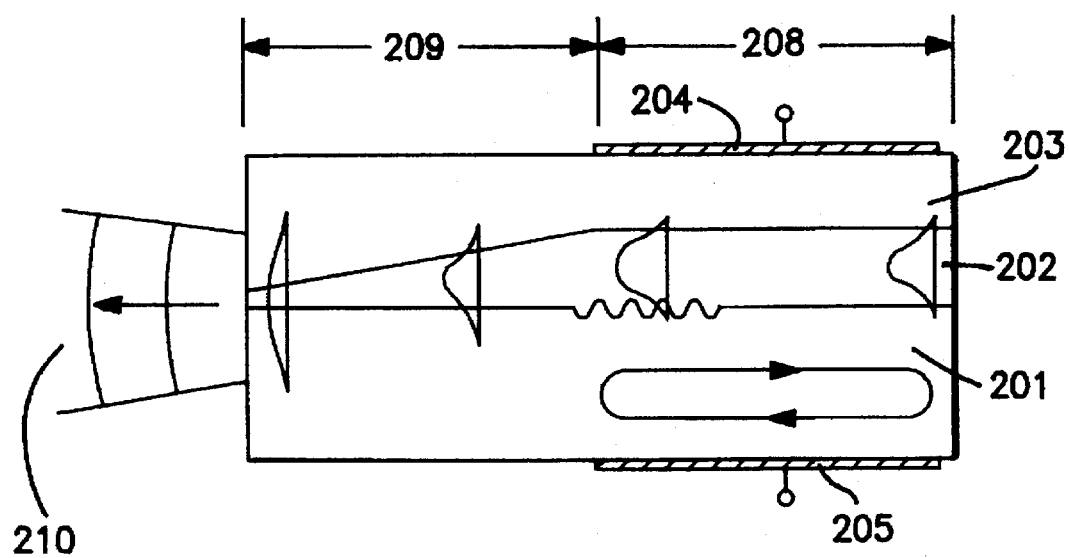
FIG. 7 is a longitudinal sectional view showing a basic structure of the laser diode of the third embodiment of the present invention.

Moreover, in the case of the above embodiment, an active layer is uniformly changed. However, as shown in FIG. 7, it is also possible to make the tilt angle of the active layer 202 in the spot size conversion area 209 between the diffraction grating 206 and an emission end facet larger than the tilt angle of the active layer in the current injection area 209.

In the case of laser diodes constituted like the second and third embodiments, a laser resonator is formed between one end facet of a device and a diffraction-grating forming area. Therefore, for example, even if a device length increases to a large value of 500 µm, the length of a current injection area 208 can be decreased to 200 µm or less. Moreover, because the current injection area is limited, it is possible to realize a low threshold current, high efficiency, and preferable temperature characteristic which are features of a short cavity laser. Furthermore, because the size of a beam emitted from the LD area 208 is widened in the spot size conversion area 209, the radiation angle of an emitted beam 210 is narrowed. That is, also in the case of the laser diode shown in FIGS. 6 or 7, it is possible to realize a laser diode having features of a short cavity laser and the narrowed radiation angle characteristic of an emitted beam.

As described above, the present invention makes it possible to provide a laser diode having a narrowed radiation angle characteristic, and a low threshold current and a superior temperature characteristic which are features of a short cavity laser. Therefore, the present invention makes it possible to provide a laser diode with superior characteristics to be used as a laser for a low-cost LD module requiring no lens system.

What is claimed is:

1. A laser diode comprising: an active layer sandwiched between a substrate and a clad layer said active layer including an optical guide layer with different thickness between a first end facet and a second end facet opposed to each other such that said thickness is continuously eased from said first end facets toward said second facet serving as a main light output end facet.

2. A laser diode according to claim 1, wherein a first reflection coating is provided on said first end facet and a second reflection coating is provided on said second end facet such that a reflectance of said second reflection coating is lower than that of said first reflection coating.

3. A laser diode according to claim 1, further comprising a diffraction grating formed on a part of said active layer and an area from said first end facet up to said diffraction grating is used as a current injection area.

4. A laser diode according to claim 3, wherein said current injection area has a length of 200 nm or less.

5. A laser diode according to claim 3, wherein an inclination of said active layer in said current injection area is smaller than that of said active layer between said diffraction grating and said second end facet.

* * * * *